United States Patent [19]

Dobrovolny

[11] Patent Number: 4,461,040
[45] Date of Patent: Jul. 17, 1984

[54] INTEGRATED SINGLE BALANCED MIXER/OSCILLATOR WITH SLOT AND HYBRID COUPLER

[75] Inventor: Pierre Dobrovolny, North Riverside, Ill.

[73] Assignee: Zenith Radio Corporation, Glenview, Ill.

[21] Appl. No.: 456,158

[22] Filed: Jan. 6, 1983

[51] Int. Cl.³ ............................................. H04B 1/26
[52] U.S. Cl. .................................. 455/327; 455/330
[58] Field of Search .............................. 455/325–328, 455/330; 333/124, 125, 26

[56] References Cited

U.S. PATENT DOCUMENTS 4,355,421 10/1982 Seely ..................................... 455/327
4,359,781 11/1982 Hallford .............................. 455/327
4,371,982 2/1983 Hallford .............................. 455/327

FOREIGN PATENT DOCUMENTS 54-71916 6/1979 Japan ................................... 455/328

OTHER PUBLICATIONS

"An MOS Down Converter of Thick-Film MIC For 2 GHZ Pay TV", by Uwamo et al, *IEEE Transaction on Consumer Elec.*, vol. CE-27, No. 3, 8/1981.

*Primary Examiner*—Jin F. Ng

[57] ABSTRACT

In an RF receiver, the unsymmetric RF input to a single balanced mixer is provided from the preceding portion of the receiver by means of a hybrid coupler to provide DC decoupling and impedance transformation at the RF and image frequencies. The hybrid coupler includes first and second microstrip conductors on the first side of a circuit board, each respectively coupled to the preceding portion of the receiver such as to a preamplifier and to the mixer and mutually electromagnetically coupled. On a second side of the circuit board is located a slot etched in the circuit board's conductive ground plane providing the single balanced mixer with a symmetric oscillator frequency source. The ground plane in which the slot is located forms one wall of a cavity in which a dielectric resonator is contained which, coupled to either end of the slot and in combination with an active device, forms the oscillator frequency source. Optimum performance of the oscillator and the mixer requires choosing the proper length of the slot, proper positioning of the mixer and active device connections along the slot and providing the active device itself with proper feedback elements (transmission line stubs) on all of its ports. The integrated mixer/oscillator of the present invention thus forms an inexpensive, compact and efficient frequency downconverter particularly adapted for use in the front end of a microwave satellite television receiver.

9 Claims, 2 Drawing Figures

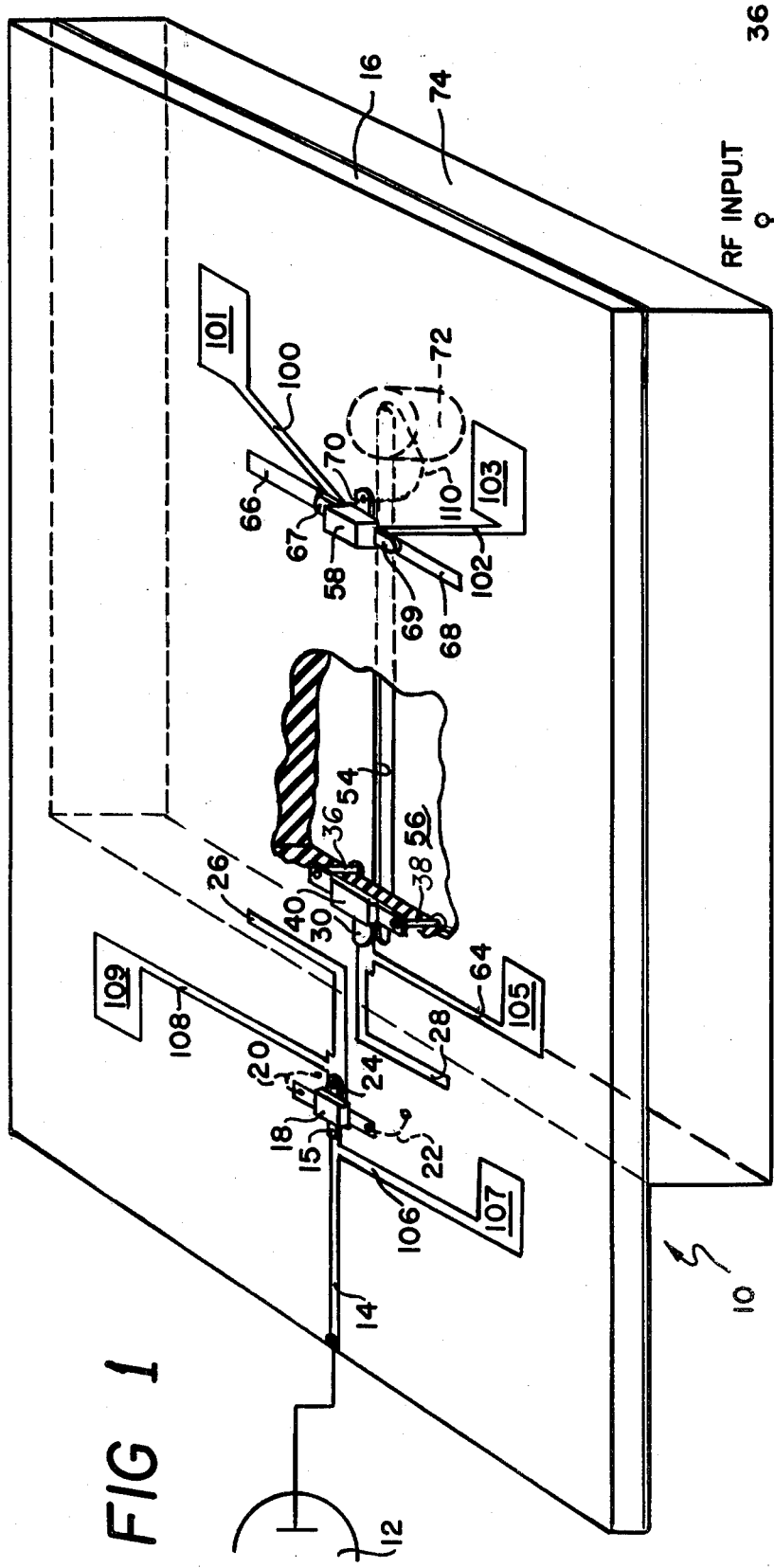

INTEGRATED SINGLE BALANCED MIXER/OSCILLATOR WITH SLOT AND HYBRID COUPLER

BACKGROUND OF THE INVENTION

The present invention relates generally to an RF receiver and is particularly directed to an integrated mixer/oscillator for use in a low cost microwave receiver circuit.

The front end of a radio frequency (RF) receiver generally includes an element responsive to the incident RF energy, a preamplifier for amplifying the thus recovered received signal and a frequency downconverter for translating the received signal to a more convenient, lower frequency. The downconverter portion of the receiver generally includes a mixer to which is provided the received RF signal and which is coupled to a source of a reference frequency such as a local oscillator. It is in the mixer that the received signal is heterodyned with the reference signal in generating an intermediate frequency (IF) signal for processing in the remainder of the receiver.

At higher frequencies in the RF spectrum expensive hybrid microcircuits are frequently used in the receiver's front end and downconverter. These circuits typically include discrete components sometimes in combination with integrated circuit (IC) construction generally utilized at the lower IF frequencies or in other auxiliary functions. The discrete component are typically connected by means of microstrip conductors used also as interstage impedance transformation circuits frequently in combination with conductive strips referred to as "stubs" within the various stages of the receiver. DC decoupling for RF signal processing is provided by discrete "chip" capacitors coupled to respective stages in the receiver to permit only the transmission of the received RF information between the stages. In addition, most prior art mixer/oscillator circuits include complex filter circuitry for rejection of the local oscillator and image frequencies and recovery of the intermediate frequency signal. These filter networks may include various filters in the IF output port, in the RF signal input port and in the local oscillator input port. This approach requires the incorporation of many discrete devices and transmission line elements into the circuit which must then be tuned to a predetermined frequency range of operation. This has usually resulted in excessive fabrication costs for these systems.

The present invention overcomes the aforementioned limitations of the prior art by providing an integrated mixer/oscillator circuit for use in the front end of an RF receiver which is particularly adapted for low cost printed circuit implementation. The integrated mixer/oscillator circuit of the present invention eliminates the need for complex interstage impedance matching, DC decoupling and signal filtering circuitry without loss of performance.

OBJECTS OF THE INVENTION

Accordingly, it is an object of the present invention to provide a low cost, compact integrated mixer/oscillator for use in an RF receiver particularly adapted for operation in the SHF band and suitable for mass production.

It is another object of the present invention to provide simplified interstage impedance transformation, RF coupling and DC decoupling in a mixer/oscillator circuit without the usual passive devices and other associated circuitry.

Yet another object of the present invention is to provide reduced mixer conversion loss and improved noise figure in an RF receiver by providing the RF input to the mixer with the proper impedance at both the RF and image frequencies.

A still further object of the present invention is to provide an improved approach for generating an oscillator signal and coupling it directly to the mixer stage of an RF receiver.

BRIEF DESCRIPTION OF THE DRAWINGS

The appended claims set forth those novel features believed characteristic of the invention. However, the invention itself, as well as further objects and advantages thereof, will best be understood by reference to the following detailed description of a preferred embodiment taken in conjunction with the accompanying drawings in which:

FIG. 1 is a perspective view of an integrated mixer/oscillator with a slot and hybrid coupler in accordance with the present invention; and FIG. 2 is a schematic diagram of the diode and terminal arrangement of the mixer circuit utilized in a preferred embodiment of the integrated mixer/oscillator of FIG. 1.

DESCRIPTION OF THE PREFERRED EMBODIMENT

Referring to FIG. 1, there is shown an upper perspective view of an integrated mixer/oscillator 10 in accordance with the present invention.

An RF carrier signal is received by antenna 12 and provided to an input microstrip conductor 14 on the circuit board 16. The microstrip conductor 14 is comprised of a metallic-strip conductor bonded to the circuit board 16, which is a dielectric sheet comprised of a teflon-fiberglass substrate with a low dielectric constant in a preferred embodiment. To the other side of the circuit board 16 is bonded a metallic ground plate, or plane, 56 which is maintained with regard to the RF and IF signals at a reference voltage level termed circuit board ground. The input microstrip 14 is connected to the input pin 15 of a packaged RF preamplifier device 18 and provides the received RF carrier signal thereto. The common electrode of the preamplifier device 18 is connected to the other side of the substrate, i.e., to circuit board ground, in the shortest possible way such as by two plated holes through the circuit board 16 or by two jumper wires 20, 22 inserted therethrough. In another embodiment (not depicted in FIG. 1) of the present invention, the preamplifier circuit may include two gallium arsenide (GaAs) field-effect transistors (FET), in an inverted position inserted through a square hole (not shown) in the circuit board with the source electrode of each transistor directly soldered to the circuit board ground plane 56. High characteristic impedance transmission lines 106, 108 and capacitive pads 107, 109 respectively coupled thereto provide proper biasing for the preamplifier device 18. The electrical length on the substrate of transmission lines 106, 108 is ¼ the wavelength of the RF frequency.

The amplified RF output from the preamplifier device 18 is provided via the output pin 24 thereof to a first microstrip conductor 26. Coupled to the first microstrip conductor 26 and positioned on the upper side of circuit board 16 is a second microstrip conductor 28 which, in turn, is connected to the RF input pin 30 of a mixer device 40. Microstrips 26, 28 thus form an adjustable hybrid coupler (adjustment is possible by varying the length of the uncoupled conductors) wherein the respective microstrips are mutually capacitively and inductively coupled such that the output of preamplifier device 18 is conjugately matched at the RF frequency and properly mismatched at the image frequency to the mixer device 40. This is done in order to improve the conversion loss and noise figure of the mixer. The capacitive and inductive coupling of the hybrid coupler formed of first and second microstrips 26, 28 is determined by the respective dimensions of these conductors, by the dielectric constant of the substrate and the spacing between these microstrips, and marginally also by other physical factors. These characteristics of such hybrid couplers are typically determined empirically, but microwave circuit analyzing computer programs are increasingly being utilized to determine circuit parameters for optimum performance. These physical dimensions are not provided herein as they do not form a part of the present invention since the determination of optimum coupler dimensions and spacing involves conventional techniques well known to those skilled in the art.

The preamplifier 18 and mixer stage 40 may thus be optimally coupled by proper selection of both the coupled and uncoupled sections of the first and second microstrip conductors 26, 28. Furthermore, the gap between the first and second microstrip conductors 26, 28 provides for DC decoupling between the preamplifier and mixer stages 18, 40 while permitting the AC RF signal to the be transmitted. Thus, first and second microstrips 26, 28 provide interstage impedance matching as well as DC decoupling between the preamplifier and mixer stages 18, 40. This substantially simplifies and reduces the cost of the integrated mixer/oscillator 10 of the present invention by eliminating the need for complicated impedance matching circuitry as well as the incorporation of discrete capacitor chips for interstage DC decoupling. Finally, the impedance matching circuitry based on coupled microstrips 26, 28 also functions as an image filter by reflecting the image frequency back into the RF preamplifier device 18.

The second and symmetric input to the mixer device 40 is implemented by means of very short jumper wires or conductive strips 36, 38 connecting diodes 60, 62 to respective lateral edges of a slot 54 in the ground plane 56 located on a second, opposite side of circuit board 16 from that on which the preamplifier and mixer circuits are positioned. A schematic diagram of the mixer circuit 40 is shown in FIG. 2. The RF input is provided from the second microstrip conductor 28 to the junction between diodes 60, 62. An oscillator frequency signal is provided from the slot 54 via jumper wires 36, 38 to the diodes 60, 62 which are thus rendered conductive for one half period of the oscillator frequency signal. The manner in which the lower frequency, oscillator signal is generated in slot 54 is explained below. The lower frequency, oscillator signal is thus mixed with the RF input signal in the mixer device 40 and transmitted via inductive transmission line 64 and capacitive pad 105 as an intermediate frequency (IF) output signal to IF signal processing circuitry (not shown). Transmission line 64 and capacitive pad 105 provide an output path from the mixer device 40 for the IF signal with respect to which the combination of these elements is virtually transparent. Transmission line 64 thus has a low impedance at the IF frequency and is essentially transparent to the transmission of the IF output signal from the mixer device 40 for subsequent processing. The electrical length of transmission line 64 on the substrate is ¼ the wavelength of the RF frequency and its characteristic impedance is greater than 100 ohms. Thus, the mixer device 40 functions as a single balanced mixer in which the RF input signal is decoupled from the reference frequency signal by means of symmetrically connected diodes 60, 62.

The mixer device 40 is coupled to respective edges of the slot 54 by means of jumper wires 36, 38 or by means of plated through holes in the circuit board 16. An oscillator device 58 is located on the first side of the circuit board 16 while dielectric resonator 72 is positioned on the second side of the circuit board. Also positioned on the second side of the circuit board 16 is a cavity 74 comprised of a plurality of walls made of conductive material, with one of the walls being formed by the ground plane 56 positioned on the second side of circuit board 16. The cavity 74 thus formed on the second, lower side of circuit board 16 is positioned thereon so as to enclose the combination of slot 54 and dielectric resonator 72. Oscillator device 58 and dielectric resonator 72 are both coupled to the same end, or mutually opposite end portions, of slot 54 so as to form an oscillator which is coupled to an input of the mixer device 40 by jumper wires 36, 38, as previously explained. In this manner, the energy of the high-Q resonator 72 is prevented from being lost by radiation into space and is directed into the area of the slot 54 where it may be efficiently coupled to the aforementioned mixer device 40. The reference frequency is determined primarily by the ceramic resonator 72 and to a lesser extent by other factors such as cavity dimensions, feedback network, etc. In addition, the resonator 72 provides for the thermal stability of the frequency of the oscillator 58.

In a preferred embodiment, oscillator device 58 is a field-effect transistor (FET) device with the high-Q dielectric resonator 72 coupled to either end of the slot 54. Also, in a preferred embodiment the RF carrier frequency is about 12 GHz while the oscillator reference frequency is approximately 11 GHz. Transmission lines 66, 68 together with short conductor 110, which are respectively connected to the gate 67, drain 69 and source 70 of oscillator FET 58, form a part of the oscillator feedback circuit. Transmission lines 66, 68 and conductor 110 may be dimensioned, or sized, so as to minimize the tendency of the oscillator 58 to oscillate at spurious frequencies. The combination of transmission lines 100, 102 and capacitive pads 101, 103 respectively coupled thereto provide for the proper biasing of oscillator device 58, with the electrical length on the substrate of transmission lines 100, 102 equal to ¼ the wavelength of the oscillator frequency.

Slot 54 acts essentially as a three port impedance transformer between the combination of oscillator device 58, resonator 72 and the mixer device 40. Adjacent points along the facing edges of slot 54 behave as the ports of a symmetric transmission line terminated with a short on both ends. In addition, the impedance transformations between the oscillator device 58 and resonator 72 and the mixer device 40 are determined by the position along the slot 54 where the oscillator device 58 and transmission lines 66, 68 are located and the position at which jumper wires 36, 38 are coupled to the edges of slot 54 along the length thereof. Thus, by selectively positioning mixer device 40 along the length of slot 54, the mixer device 40 may be optimally coupled to the reference frequency signal source. This eliminates the need for discrete chip capacitors, microstrip filters and directional couplers for coupling and impedance transformation between the mixer and oscillator of the present invention.

The mixer device 40 may also be mounted on the opposite, lower side of the circuit board 16 with its tabs directly soldered to the edges of slot 54 and with tab 30 connected to transmission line 28 by means of a plated through hole (not shown in FIG. 1). A preferred mounting for the mixer device 40 involves connecting the center conductor 61 between diodes 60, 62 to a plated top of a package in which diodes 60, 62 are packaged, which conductor is connected such as by soldering to microstrip conductor 28 without the use of jumper wires or plated through holes. Without resonator 72, the electrical length of slot 54 would be about ½ wavelength of the oscillator frequency. Also without resonator 73, the length of slot 54 may be established to minimize any tendency of the oscillator device 58 to oscillate at spurious frequencies.

There has thus been shown an integrated low conversion loss mixer/oscillator combination which is of simplified design and low cost while also providing image frequency rejection in a compact circuit design. The present invention is particularly adapted for downconverting an SHF received signal to an intermediate frequency signal of approximately 1 GHz as required in the front end of a satellite television receiver.

While particular embodiments of the present invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A system for converting a first, microwave signal provided to an input stage of an RF receiver to a second, lower frequency signal, said system comprising:
   a dielectric circuit board having a conductive ground plane on a first side thereof;
   a first microstrip conductor positioned on a second side of said circuit board and connected to said receiver input stage for receiving said first signal;
   a single balanced mixer circuit having a symmetric reference frequency input port and an unsymmetric RF input port;
   a second microstrip conductor located on the second side of said circuit board and connected to said mixer circuit and electromagnetically coupled to said first microstrip for providing a DC decoupled and filtered RF signal to the unsymmetric RF input port of said mixer circuit in response to said first signal, said first and second microstrip conductors sized and positioned relative to one another so as to provide an optimum impedance transformation between the output of said receiver input stage and said single balanced mixer circuit;
   a reference frequency signal generator; and
   a slot of predetermined length in the ground plane of said circuit board coupling said reference frequency signal generator and the symmetric reference frequency input port of said mixer circuit for providing a reference frequency signal to said mixer circuit in generating said second, lower frequency signal therein.

2. A system in accordance with claim 1 wherein said input stage includes a preamplifier circuit coupled to said first microstrip conductor in said RF receiver.

3. A system in accordance with claim 1 wherein the length of said slot is an integral multiple of a half wavelength of said reference frequency signal.

4. A system in accordance with claim 1 wherein said reference frequency signal generator includes the combination of a dielectric resonator, an active device and a feedback network wherein said dielectric resonator and said active device are respectively positioned on the first and second sides of said circuit board and are coupled to said slot in forming an oscillator circuit, and a conductive cavity positioned on the first side of said circuit board and enclosing said slot and said dielectric resonator for improving the frequency stability of said oscillator circuit.

5. A system in accordance with claim 1 wherein said single balanced mixer circuit includes two unidirectional conducting devices connected in series and respectively rendered conductive during alternating half cycles of said reference frequency signal and wherein said first signal is decoupled from said reference frequency signal.

6. A system in accordance with claim 1 wherein said reference frequency signal generator is connected to one end of said slot with said mixer circuit connected to said slot a predetermined distance from said reference frequency signal generator and wherein optimum impedance transformation between said mixer circuit and said reference frequency signal generator is provided by said predetermined distance and the length of said slot.

7. A system in accordance with claim 1 wherein said input stage is a preamplifier in a satellite television receiver and wherein said first signal is a received SHF signal which is converted to a second, lower intermediate frequency signal for processing in said satellite television receiver.

8. A system in accordance with claim 7 wherein said received SHF and said second, lower intermediate frequency signals are respectively at 12 GHz and 1 GHz.

9. A frequency downconverter for translating a microwave signal provided to the front end of an RF receiver to a lower frequency IF signal, said downconverter comprising:
   a circuit board havng a conductive ground plane on one side thereof;
   a mixer circuit mounted on said circuit board and including an RF input port and a reference frequency input port;
   an impedance transforming, DC decoupled network mounted on said circuit board and including first and second microstrip conductors respectively connected to the receiver's front end and to said mixer circuit and mutually RF coupled together for providing an RF signal to the RF input port of said mixer circuit in response to said received microwave signal;

a reference frequency source including an active device, a feedback network and a dielectric resonator mounted on said circuit board; and a slot located in said conductive ground plane and coupling said mixer circuit and said reference frequency source in forming a compact mixer/oscillator combination for providing a reference frequency signal to the reference frequency input port of said mixer circuit for generating said lower frequency IF signal, wherein said mixer circuit is coupled to respective, facing edge portions of said slot at a predetermined distance from the ends thereof so as to provide an optimum load for said reference frequency source.

* * * * *